United States Patent [19]
Afghahi

[11] Patent Number: 6,093,924
[45] Date of Patent: *Jul. 25, 2000

[54] GAIN AND ERROR CORRECTION CIRCUITRY

[75] Inventor: Morteza Afghahi, Tempe, Ariz.

[73] Assignee: Intel Corporation, Santa Clara, Calif.

[ * ] Notice: This patent is subject to a terminal disclaimer.

[21] Appl. No.: 09/004,951

[22] Filed: Jan. 9, 1998

[51] Int. Cl.$^7$ .............................. H01L 27/00; H04N 3/14
[52] U.S. Cl. .......................................... 250/208.1; 348/308
[58] Field of Search ........................ 250/208.1; 348/294, 348/296, 297, 302, 307, 308, 909; 327/514, 515

[56] References Cited

U.S. PATENT DOCUMENTS 5,471,515  11/1995  Fossum et al. .
5,877,715   3/1999  Cowda et al. ......................... 348/294

OTHER PUBLICATIONS

J.E.D. Hurwitz, P.B. Denyer, D.J. Baxter, and G. Townsend, "An 800K–Pixel Color CMOS Sensor for Consumer Still Cameras," SPIE vol. 3019 (1997), pp. 115–124.

S.K. Mendis, S.E. Kemeny, R.C. Gee, B. Pain, Q. Kim, and E.R. Fossum, "Progress in CMOS Active Pixel Image Sensors," SPIE vol. 2172 (1994), pp. 19–29.

*Primary Examiner*—Seungsook Ham
*Assistant Examiner*—Kevin Pyo
*Attorney, Agent, or Firm*—Blakely, Sokoloff, Taylor & Zafman LLP

[57] ABSTRACT

Gain and error correction circuitry for metal-oxide-semiconductor (MOS) analog storage circuits, including image sensors. The correction circuitry allows the analog output signal for a storage cell to substantially track an input signal in each cell. Voltage dependent distortion and attenuation in the output signal, with respect to the input signal, is minimized, without significantly increasing the size of each cell.

16 Claims, 5 Drawing Sheets

GAIN AND ERROR CORRECTION CIRCUITRY

BACKGROUND INFORMATION

This invention is generally related to analog signal processing and more particularly to gain and error correction in analog storage circuits.

Analog storage circuits are commonly used to store different types of analog information. For example, an image sensor can be viewed as a type of analog storage circuit which provides signals representing light intensity. The image sensor contains an array of photocells that are electrically responsive to incident light. The photocell through readout circuitry provides an output signal that represents a light-generated signal inside the photocell.

One of the tasks for using analog storage arrays is to faithfully read the stored information. The task becomes particularly difficult for larger and denser arrays in which the smaller size of the individual cells restricts the range of circuits that can be used as readout circuitry in each cell.

For example, FIG. 1 illustrates in relevant part a typical compact prior art photocell 104. The cell 104 using only a few MOS circuit elements, such as the field effect transistor (FET), operates as described below.

The following short cuts are used in this disclosure to describe various operating regions of the MOS field effect transistor (FET). An FET is said to be "turned off" when $V_{GS}$ (gate-source voltage) $\leq V_T$ (threshold voltage) for the device and the device is operating in the cut-off region where its channel acts as an open circuit. When a FET is "turned on", $V_{GS} > V_T$, $V_{DS}$ (drain-source voltage) is normally small and the device is operating in the non-saturation region.

The cell 104 operates in response to RESET and SAMPLE signals being used to turn on $M_{13}$ and $M_{14}$ which causes the voltage at node A ($V_{IN}$) to rise to a reset value. When the desired object or scene comes into view of the image sensor containing the cell 104, a timer (exposure timer, not shown) is triggered and $M_{13}$ is turned off. Thereafter, photo-generated electron-hole pairs in photo-diode $D_{10}$ cause a photocurrent (light-generated signal) Iphoto which discharges the capacitor $C_{10}$ through $M_{14}$ and consequently results in $V_{IN}$ decaying. When the timer runs out, $M_{14}$ is turned off, leaving an exposed value for $V_{IN}$ on $C_{10}$. $M_{14}$ thus acts as an electronic shutter in limiting the light energy detected by the pixel. The difference between the reset value of $V_{IN}$ and the exposed value, together with the exposure or "integration" time defined by the timer, gives a measure of the incident light energy detected by the pixel.

To read the light intensity information in $V_{IN}$, the prior art cell 104 includes readout circuitry having $M_{11}$ and $M_{12}$. $M_{11}$ is used as an amplifier whereas $M_{12}$ is a switch. The readout circuitry together with a load (provided external to the cell, but not shown) on node B form an amplifier in a source follower configuration having a voltage gain less than one but a current gain greater than one when a SELECT signal is applied that turns on $M_{12}$. When that happens, an analog signal $V_{OUT}$ representative of $V_{IN}$ (and hence the information stored in the cell) may be read from the cell. An example of an active pixel (photocell) with associated readout circuitry is discussed in U.S. Pat. No. 5,471,515, "Active Pixel Sensor With Intra-Pixel Charge Transfer," to Fossum et al.

For a cell having ideal read-out circuitry, $V_{OUT}$ will equal $V_{IN}$ (voltage gain of exactly one) for the entire range of $V_{IN}$. However, for an actual prior art cell such as cell 104, $V_{OUT}$ is a non-linear function of $V_{IN}$. Any non-linearity or deviation from the ideal presents an additional problem for the system designer to deal with, as the detected information deviates from the actual information.

The non-linearity in $V_{OUT}$ is known as gain distortion and may be caused by $V_T$ modulation, where the gain of $M_{11}$ in the readout circuitry is modulated in response to a changing threshold voltage $V_T$ of $M_{11}$. This occurs because $M_{11}$ is implemented as a n-channel FET in a P-substrate, where the P-substrate is connected to zero potential or ground. The source to substrate (bulk) voltage for $M_{11}$ in this configuration is non-zero and changing for different values of $V_{OUT}$. As a result, $V_T$ for $M_{11}$, and therefore the gain of $M_{11}$, is changing as a function of $V_{OUT}$.

The prior art cell 104 also suffers from reduced dynamic range, due to the source follower configuration of the readout circuitry which cannot provide voltage gain per se. This is because $V_{OUT}$ is derived from the voltage at the source node of $M_{11}$, which voltage is always smaller than $V_{IN}$ being the gate voltage of $M_{11}$. The lower dynamic range is particularly a problem at the low end where $V_{IN}$ approaches 1 volt, as $V_{OUT}$ cannot follow such low input voltages due to the gate-source drop across $M_{11}$ and the drain-source drop across $M_{12}$.

In addition to gain distortion and reduced dynamic range discussed above, the output signals of cells in a large array, particularly an imaging array having hundreds of thousands of cells, are susceptible to errors (small differences between design and actual values). These may be caused by manufacturing variations among the many cells in the array, and by readout noise originating in the signal path beyond the source node of $M_{11}$.

In view of the above, it would be desirable to have a circuit which may correct for some or all of the above disadvantages that exist in analog storage circuits, and particularly in photocells.

SUMMARY

The invention in one embodiment is directed at a circuit having first and second portions coupled together at an intermediate node. The first portion has at least one first device that is a replicate of a second device in the second portion. The second portion is configured to provide an output signal that is linearly proportional to an input signal received by the first portion in response to the first and second devices conducting substantially the same amount of current.

BRIEF DESCRIPTION OF THE DRAWINGS

The above briefly summarized aspects and features of the invention may be better understood by referring to the detailed description, the claims, and the drawings below where:

DETAILED DESCRIPTION

As briefly summarized above, the invention is directed at a circuit for improving the transfer function of an analog storage cell in order to provide a more faithful representation of the cell's information. The correction circuitry can be shared by a group of cells, where each correction circuit has devices that are replicates of those in a cell's readout circuitry. The correction circuit provides an output signal that is linearly proportional and in many cases substantially the same as an input signal of a selected cell in response to conducting the same amount of current as the readout circuitry of the selected cell.

In another embodiment, the circuit is used in conjunction with a photocell in an image sensor. The first portion is part of the readout circuitry of the photocell and the second portion is part of a correction circuit that is shared by a group of photocells in the sensor. The photocell generates an input signal to its readout circuitry that is related to a photogenerated signal. The correction circuit associated with the photocell provides an output signal of the sensor that is linearly proportional to the input signal in response to the readout circuitry and the correction circuitry conducting the same amount of current. By using a number of correction circuits, for instance one for each column of the sensor array, the image sensor thus provides sensor signals that more faithfully represent the information in each photocell and over a greater dynamic range than the prior art cell 104.

The various embodiments of the correction circuitry can help reduce errors (differences in circuit operation between design and actual values) due to device mismatching between cells, as well as provide more linear unity gain with greater dynamic range than the prior art cell 104. By locating the correction circuitry outside of each cell, individual cell size is also kept small thereby permitting denser and greater resolution image sensors.

For purposes of explanation, specific embodiments are set forth below to provide a thorough understanding of the invention. However, as understood by one skilled in the art, from reading this disclosure, the invention may be practiced without such details. Furthermore, well-known elements, devices, process steps, and the like, are not set forth in detail in order to avoid obscuring the invention.

Figure 1:
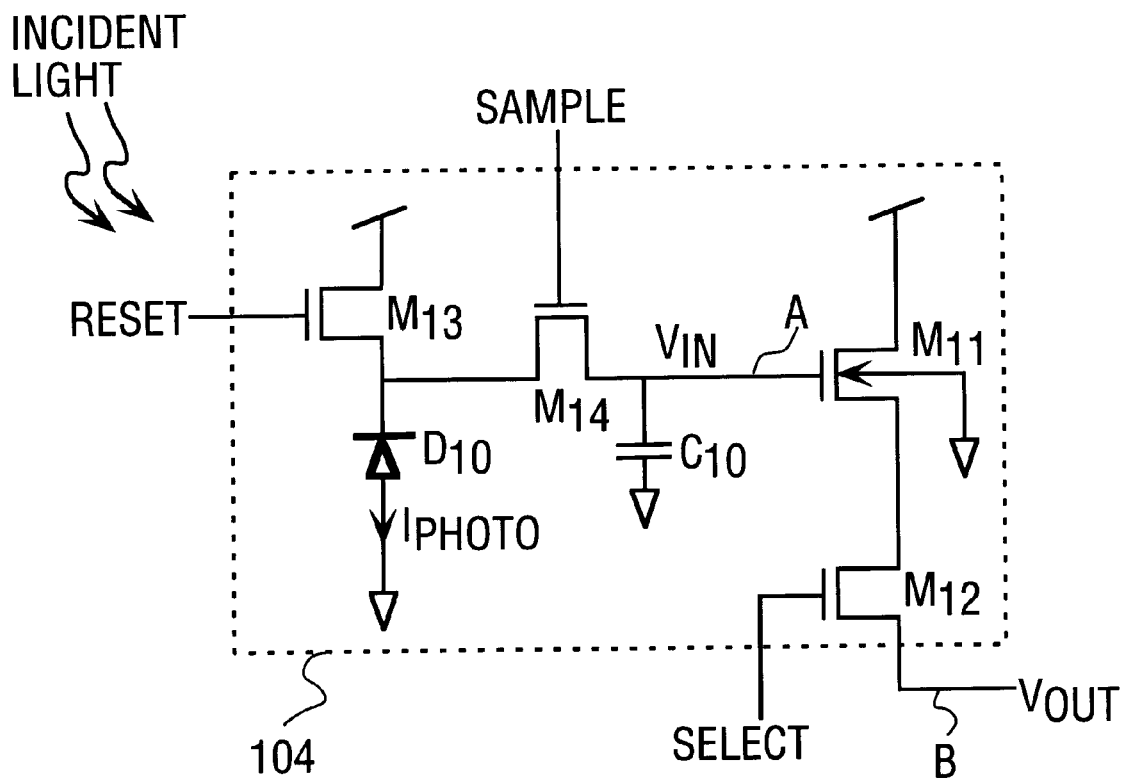
FIG. 1 illustrates a prior art photocell.
Figure 2:
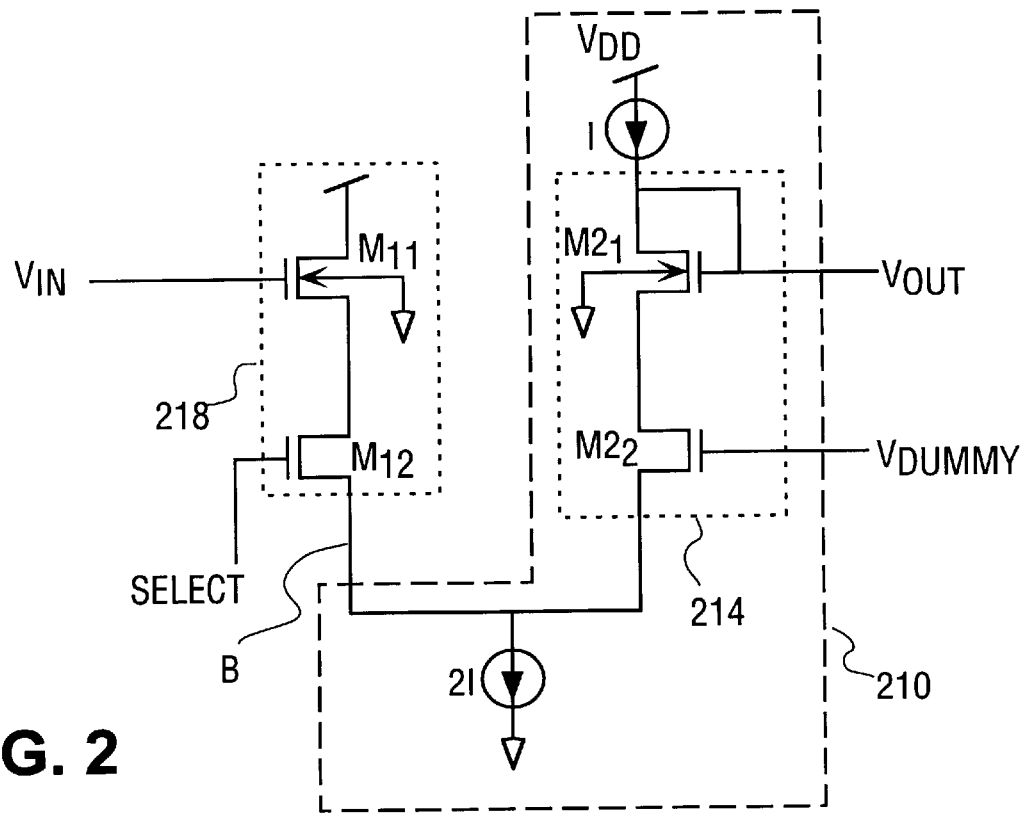
FIG. 2 is a schematic of a first embodiment of the invention as a correction circuit coupled to an analog storage cell's readout circuitry.

FIG. 2 illustrates a first embodiment of the invention as readout circuitry or output stage 218 of an analog storage cell with a cell output node B coupled to a correction circuit 210. The correction circuit 210 includes an output stage 214 that has devices which are replicates, i.e., have matching physical characteristics, with those in the cell's readout circuitry 218. For instance, where the readout circuitry 218 includes an amplifying device such as n-channel FET $M_{11}$, the output stage 214 includes a corresponding amplifying device being n-channel FET $M_{21}$ which is a replicate of $M_{11}$. In addition, the readout circuitry 218 includes a switching device such as n-channel FET $M_{12}$, corresponding to a replicate FET $M_{22}$ in the output stage 214. Other devices in addition to amplifier and switch combinations are possible and can be incorporated as replicates. The matching physical characteristics of the replicate FET devices include matching channel width and length.

The readout circuitry receives an input signal $V_{IN}$ at the gate of $M_{11}$, where the signal $V_{IN}$ can be related to information stored in an analog storage cell, such as the prior art photocell 104 described above in the background. The readout circuitry, in response to receiving $V_{IN}$ and a SELECT signal at the gate of $M_{12}$, will cause an intermediate signal to develop at node B at which there is a current sink of value 2*I, where I is the value of current forced in the devices of correction circuit 210 by the current source I. In this particular embodiment, the readout circuitry, and more specifically the amplifying device $M_{11}$, is functioning as a source follower, although other output stages may be possible.

A system having the correction circuitry 210 should be designed to generate a signal $V_{DUMMY}$ which mimics the SELECT signal, particularly when $M_{12}$ is turned on in response to SELECT. When both are turned on, switching devices $M_{12}$ and $M_{22}$ provide a low impedance path between the source of $M_{11}$ and $M_{21}$, respectively, and the cell output node B. The SELECT and $V_{DUMMY}$ signals may be generated according to known digital techniques in the art. In a particular embodiment, $V_{DUMMY}$ can simply be tied to the positive Supply $V_{DD}$ which approximates a logic high level in SELECT.

The above described components of the readout circuitry and correction circuitry operate to provide a voltage follower effect in that $V_{OUT}$ is linearly proportional to and may even substantially track $V_{IN}$, i.e., $0.97\ V_{IN} \leq V_{OUT} \leq V_{IN}$ for a wide range of $V_{IN}$. This desirable effect may be explained by the following observations.

The correction circuitry 210 features control circuitry in the form of current source I and current sink 2I as shown in FIG. 2. When the two currents have been set as I and 2I, the current through the readout circuitry 218, i.e., the current through devices $M_{11}$ and $M_{12}$, is also forced to be I in order to satisfy Kirchoff's Current Law at node B. As both the readout circuitry and the output stage 214 thus conduct the same amount of current, and since both have replicate devices with matching physical and operating characteristics, including both having the same gate-to-source voltage on the switching devices $M_{12}$ and $M_{22}$, then it can be expected that $V_{OUT}$ being the gate voltage of device $M_{21}$ is substantially the same as $V_{IN}$ which is the gate voltage of corresponding device $M_{11}$.

Any differences between the two legs feeding the current sink 2I may contribute to a difference between $V_{IN}$ and $V_{OUT}$. These differences include the voltage drop across the current source I and the fact that $M_{21}$ is diode-connected while $M_{11}$ is not. To make the left leg of the circuit more similar to the right leg, and thereby improve the tracking of $V_{OUT}$, the current source I may be implemented using FET devices which have large channel width-to-length (W/L) ratios so as to reduce their $V_{DS}$ voltage drop and thus reduce the drop across the current source I.

For improved dynamic range, the transistors $M_{11}$ and $M_{21}$ should be designed such that they are operating in their active region for as much of the range of $V_{IN}$ as possible. Similarly, transistors $M_{12}$ and $M_{22}$ should be designed such that each is turned off and turned on in response to the SELECT and $V_{DUMMY}$ signals, where $V_{DUMMY}$ mimics SELECT as much as possible when $M_{12}$ is turned on. As mentioned earlier, $V_{DUMMY}$ can be kept constant at $V_{DD}$ to reduce the complexity of the timing signal generation circuitry used for creating the various control signals for the cell.

Figure 5:
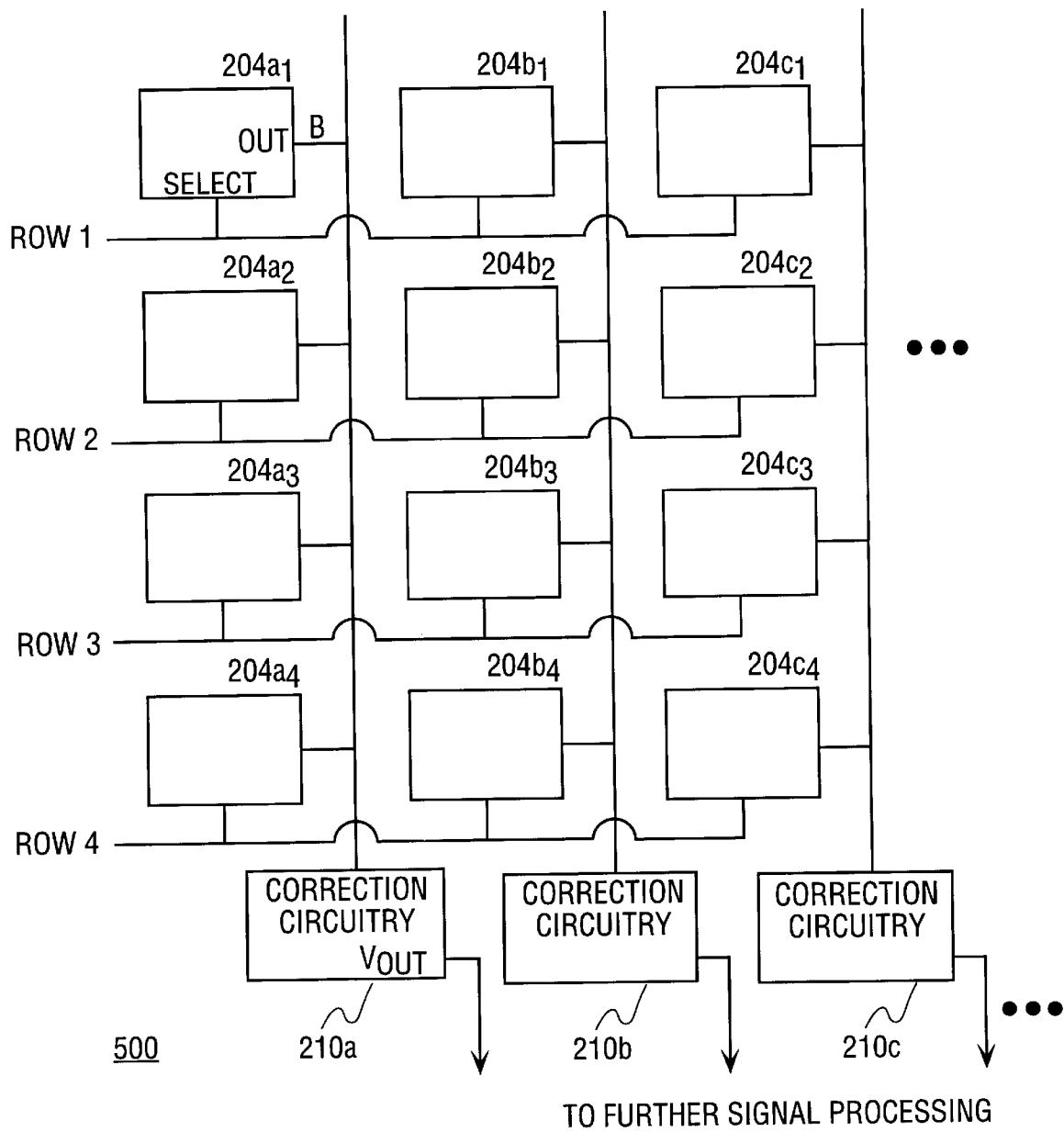
FIG. 5 is a block diagram of a sensor array embodiment of the invention.
Figure 6:
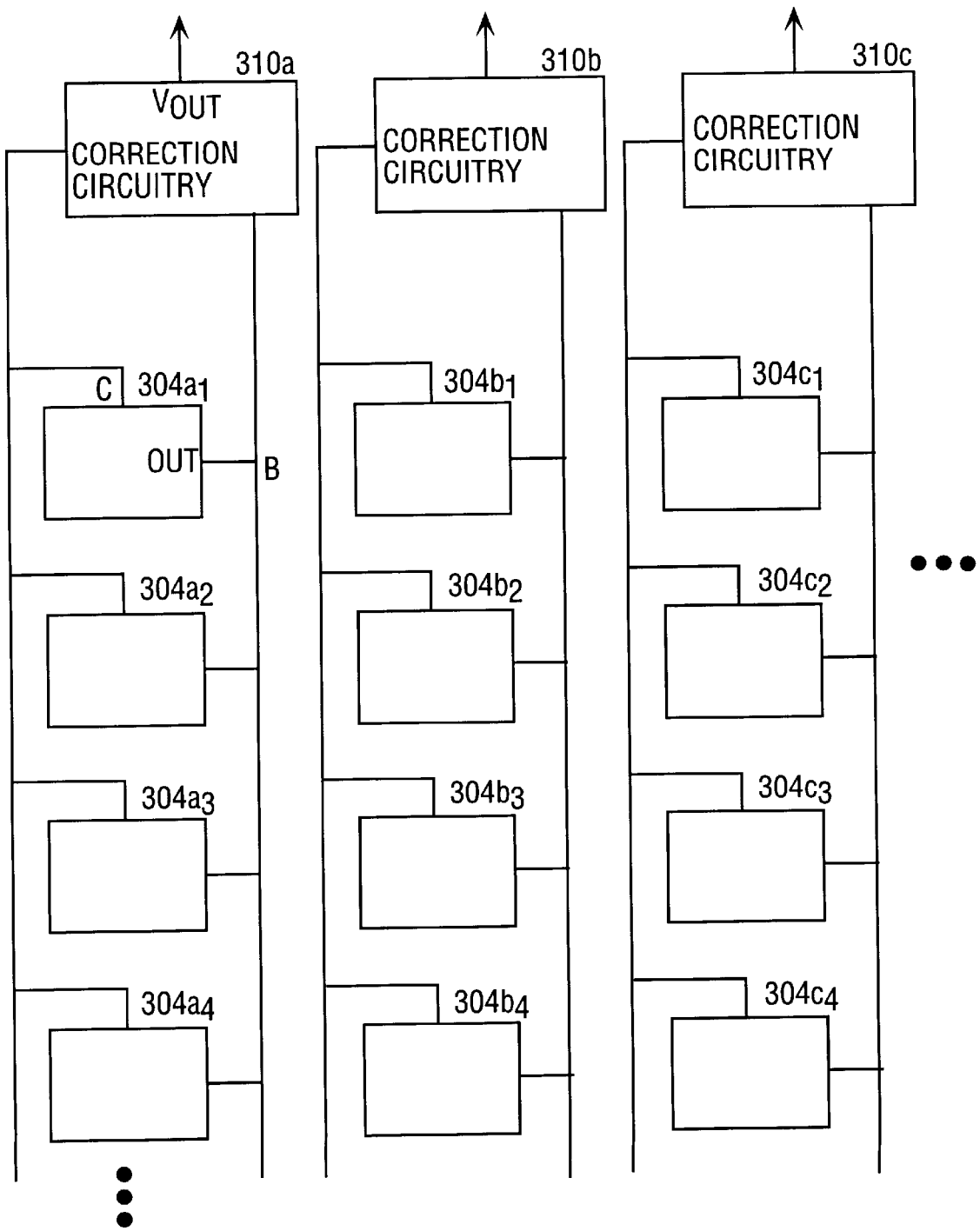
FIG. 6 is a block diagram of a second sensor array embodiment of the invention.

The current I should be selected in view of power consumption and noise immunity requirements for the system as a whole, especially if the correction circuitry is duplicated for each column of pixels in an image sensor, as seen in FIGS. 5 and 6 below. The current I, however, should, at the same time, be able to provide enough drive for the subsequent stage of analog processing beyond the correction circuitry 210.

Although the embodiment of the invention in FIG. 2 features FETs having their substrate (or bulk) connections being grounded, the circuit should operate properly even if the substrate is directly connected to the source of each transistor and may otherwise be floating.

Figure 3:
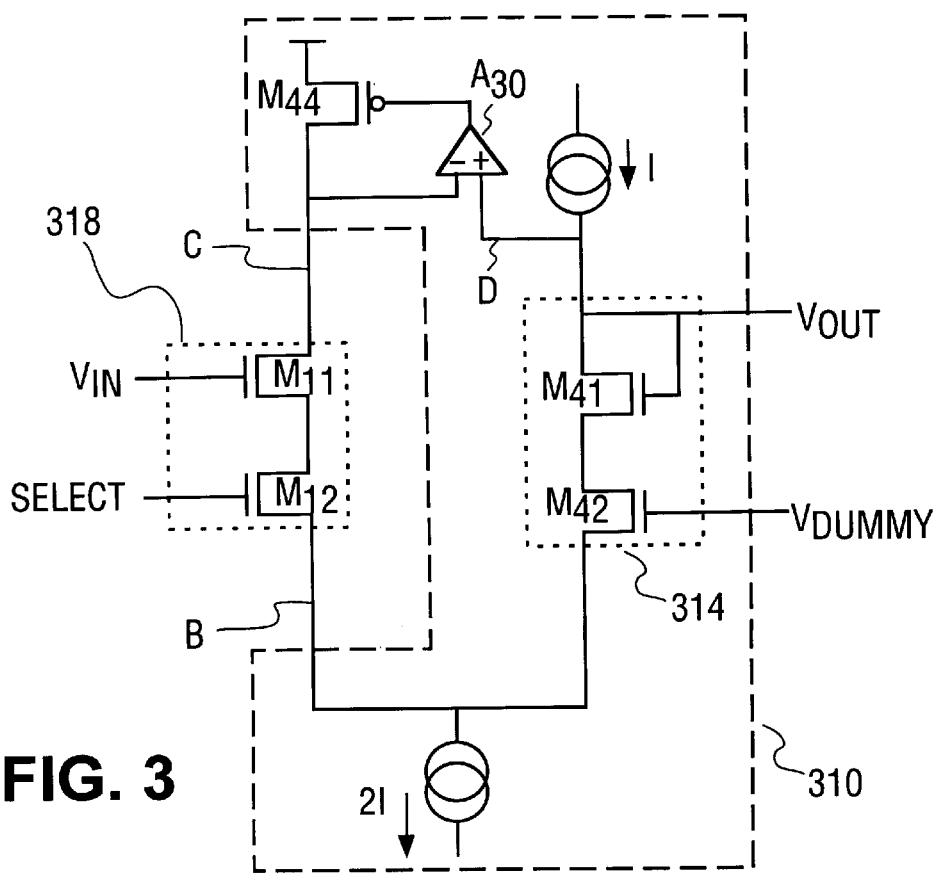
FIG. 3 is a second embodiment of the invention.

To further improve the fidelity between $V_{OUT}$ and $V_{IN}$, FIG. 3 illustrates a second embodiment of the invention as correction circuitry 310 coupled to readout circuitry 318. In this embodiment, the correction circuitry 310 includes a control circuit coupled to the readout circuitry 318 at node C and to the output stage 314 at node D. The control circuit includes an operational amplifier (opamp) $A_{30}$ driving a gate of a FET $M_{44}$ with negative feedback from node C. This configuration causes the potential at node C to track the one at node D, and helps correct higher order errors due to the voltage drop in current source I and mismatches between corresponding devices in the readout circuitry 318 and in the output stage 314.

As a simpler but less accurate alternative to the control circuit in correction circuit 310, the opamp $A_{30}$ may be eliminated and instead $M_{44}$ may be designed to conduct the current I when connected as a diode.

Figure 4:
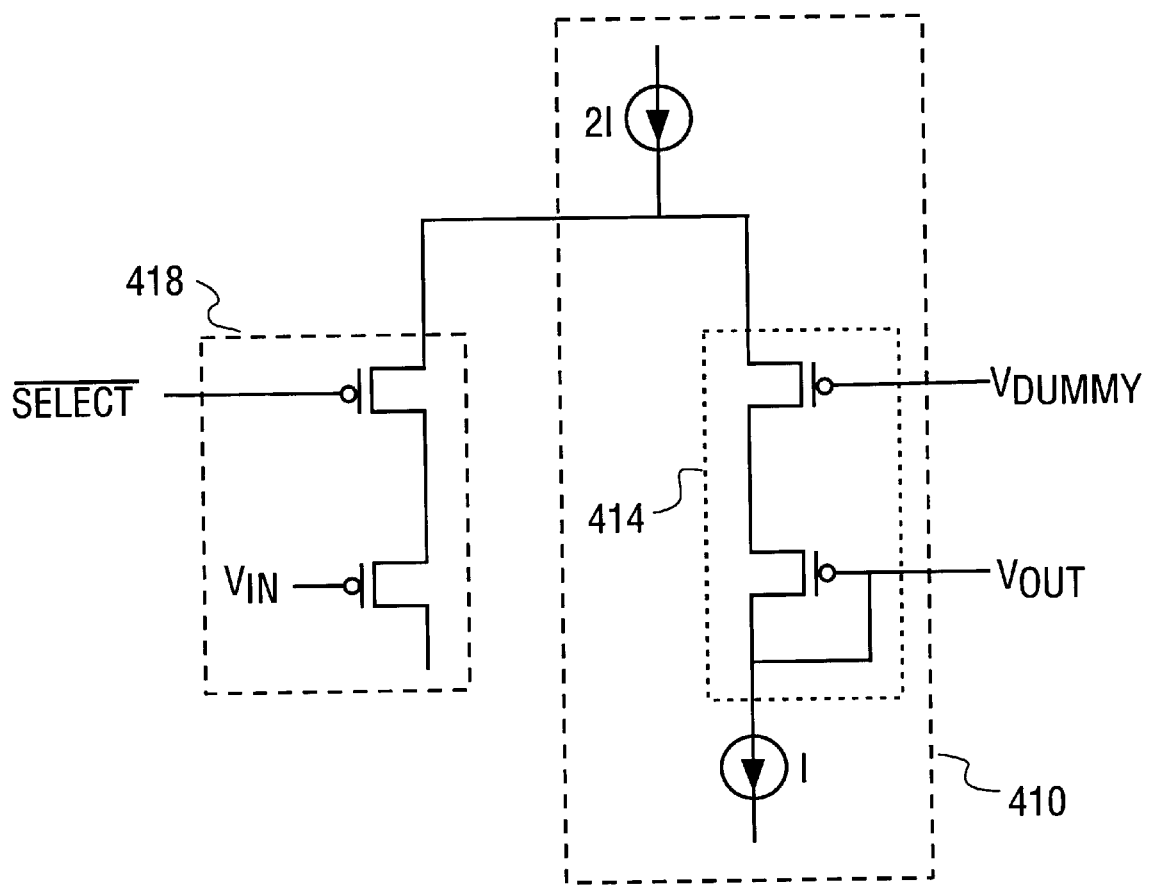
FIG. 4 is a third embodiment of the invention.

The above embodiments of the readout circuitry and correction circuitry were described as MOS circuits which can be built using n-channel FETs built in a p-substrate. FIG. 4 shows yet another embodiment of the readout and correction circuitry, this time using p-channel FET devices in both readout circuitry 418 and correction circuitry 410. The operation of the circuit in FIG. 4 can be understood by one skilled in the art using the descriptions above for the n-channel embodiments in FIGS. 2 and 3, and therefore is not further discussed in the same detail. It should be noted that in the p-channel embodiment, $V_{DUMMY}$ can now be directly connected to ground to mimic $\overline{SELECT}$ when used for reading $V_{OUT}$.

A different embodiment of the invention, this time as an image sensor 500 is shown in FIG. 5. The sensor features an array of pixels, 204a, 204b, . . . arranged as rows and columns. To reduce the space taken on a signal integrated circuit die that contains both the pixels and correction circuitry, the pixels in each column of the array are coupled to a single correction circuit 210a, 210b, 210c, . . . , respectively. The sensor 500 can be implemented as a CMOS IC, including the correction circuits 210a, 210b, . . . The pixels are multiplexed in response to ROW signals, so that the $V_{OUT}$ at the correction circuitry may be read one row at a time. The image sensor 500 can be coupled to conventional analog-to-digital (A/D) conversion circuitry which results in raw image data being produced in response to analog $V_{OUT}$ signals received from the correction circuitry. The A/D conversion circuitry can also be included on the same IC die as the pixels, but need not be. Although shown as being row multiplexed, the pixels can also be column multiplexed where the pixels in a given row receive the same correction circuitry.

FIG. 6 illustrates yet another embodiment as an image sensor 600 having an array of pixels 304a, 304b, 304c, . . . each containing readout circuitry 318 (see FIG. 3). Once again, to obtain a more compact design, each pixel in a column is connected to its respective node C and a node B, which nodes are also coupled to a single correction circuit 310a, 310b, 310c, (see FIG. 3) . . . for the column. Similar to the sensor 500, the sensor 600 provides analog output signals $V_{OUT}$ which can be forwarded to A/D conversion circuitry and further signal and image processing functions. Keeping the correction circuitry outside the pixels and shared by a column allows the overall image sensor to be kept small and provides greater resolution through the use of a large number of tightly packed pixels. Again, although shown as column circuitry, the invention may also be realized as row circuitry where pixels in each row are coupled to a respective correction circuit.

To summarize, the embodiments of the invention described above are directed at a circuit having first and second portions that have replicate devices. The first and second portions are coupled to an intermediate node. The second portion provides an output signal that is linearly proportional and substantially tracks an input signal received by the first portion due to the current in both portions being the same and due to the portions having replicate devices. Of course, the embodiments described above are subject to some variations in structure and implementation. For instance, some of the circuits described above may be implemented in a standard digital CMOS process, although other semiconductor fabrication processes could alternatively be used. Therefore, the scope of the invention should be determined not by the embodiments illustrated but by the appended claims and their legal equivalents.

What is claimed is:

1. A circuit comprising:
   a set of pixels, each having first portion having at least one first device receiving an input signal;
   second portion having at least one second device that is a replicate of the first device, the second portion being coupled to the first portion at an intermediate node;
   first control circuit for causing a first current through the second device; and
   second control circuit for causing a second current through the intermediate node,
   the second portion providing an output signal that is linearly proportional to the input signal in response to the first and second devices conducting the same amount of current.

2. A circuit as in claim 1 wherein the first device in the first portion is a FET configured as a source follower receiving the input signal.

3. A circuit as in claim 1 wherein the first control circuit comprises a current source and the second control circuit comprises a current sink.

4. A circuit as in claim 1 wherein the second current has a value twice the first current.

5. An image sensor circuit comprising
   a set of pixels associated with a pixel output (PO) node, each pixel having a first device in readout circuitry receiving an input signal, and
   correction circuitry coupled to the PO node and having an output stage with a second device that is a replicate of the first device and is configured to provide an output signal that is linearly proportional to the input signal of the pixel.

6. An image sensor circuit as in claim 5 wherein the input signal is related to a light-generated signal created by a photodetector in the selected pixel.

7. An image sensor circuit as in claim 5 wherein the output signal is provided in response to the second device conducting the same current as the first device.

8. An image sensor circuit as in claim 5 wherein the first device comprises a first FET receiving the input signal, and wherein the second device comprises a second FET providing the output signal, the first and second FETs being replicates.

9. An image sensor circuit as in claim 5 wherein the correction circuitry comprises:
   first control circuit for setting a first current in the output stage, and
   second control circuit coupled to the PO node for setting a second current at the PO node.

10. An image sensor circuit as in claim 9 where the first control circuit comprises a current source and the second control circuit comprises a current sink.

11. An image sensor circuit as in claim 8 wherein each of the first and second FETs is an n-channel FET formed in a substrate that is coupled to a ground node of the image sensor circuit.

12. An image sensor circuit as in claim 9 wherein the second current has a value twice that of the first current.

13. An image sensor circuit as in claim 5 wherein the output stage provides the output signal in response to a dummy signal having a level that matches one in a select signal applied to the readout circuitry.

14. An image sensor circuit as in claim 5 further comprising
   a control circuit coupled to the readout circuitry and the output stage to cause a first node of the readout circuitry to track a corresponding second node of the output stage.

15. An image sensor circuit as in claim 14 wherein the control circuit comprises an operational amplifier having inputs coupled to the readout circuitry and the output stage, and output driving a signal input of a transistor to control the first node.

16. An image sensor circuit as in claim 9 further comprising a load in series with the readout circuitry, for providing a voltage drop corresponding to a drop across the first control circuit.

* * * * *